United States Patent
Ahn et al.

(10) Patent No.: US 9,324,839 B2
(45) Date of Patent: Apr. 26, 2016

(54) GRAPHENE STRUCTURE, GRAPHENE DEVICE INCLUDING SAME, AND METHOD OF MANUFACTURING GRAPHENE STRUCTURE

(71) Applicant: Samsung Electronics Co., Ltd., Suwon-Si, Gyeonggi-Do (KR)

(72) Inventors: Joung-real Ahn, Suwon-si (KR); Ha-chul Shin, Suwon-si (KR); In-kyung Song, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/924,953

(22) Filed: Jun. 24, 2013

(65) Prior Publication Data

US 2014/0175458 A1  Jun. 26, 2014

(30) Foreign Application Priority Data

Dec. 21, 2012  (KR) .................. 10-2012-0151337

(51) Int. Cl.
*H01L 29/15* (2006.01)
*H01L 21/8238* (2006.01)
(Continued)

(52) U.S. Cl.
CPC ...... *H01L 29/66742* (2013.01); *C01B 31/0446* (2013.01); *H01L 21/0243* (2013.01); *H01L 21/02378* (2013.01); *H01L 21/02491* (2013.01); *H01L 21/02494* (2013.01); *H01L 21/02527* (2013.01); *H01L 21/02612* (2013.01); *H01L 29/1606* (2013.01); *H01L 29/45* (2013.01);
(Continued)

(58) Field of Classification Search
CPC ............... H01L 21/02606; H01L 51/0048; H01L 29/0669; H01L 29/413; H01L 51/0045; H01L 51/057; H01L 2221/1094; H01L 2224/05193; H01L 2224/05293; H01L 2224/05493; H01L 2224/05693
USPC ............ 438/199, 17, 582; 257/635, 741, 476, 257/209, 529
See application file for complete search history.

(56) References Cited

U.S. PATENT DOCUMENTS

| 5,665,659 A * | 9/1997 | Lee et al. ............... 438/646 |
| 2007/0096109 A1 * | 5/2007 | Seki et al. ............... 257/77 |

(Continued)

FOREIGN PATENT DOCUMENTS

| JP | 2011-178644 A | 9/2011 |
| JP | 2012-041219 A | 3/2012 |

(Continued)

OTHER PUBLICATIONS

Coletti, C. et al. "Large Area Quasi-Fee Standing Monolayer Graphene on 3C-SiC(111)." Sep. 29, 2011.

(Continued)

*Primary Examiner* — Selim Ahmed
*Assistant Examiner* — Moin Rahman
(74) *Attorney, Agent, or Firm* — Harness, Dickey & Pierce, P.L.C.

(57) ABSTRACT

A method of manufacturing a graphene structure, the graphene structure, and a graphene device including the graphene structure, include depositing a metal layer over a silicon carbide substrate; and performing, at a first temperature, a heat treatment on the silicon carbide substrate over which the metal layer is deposited to form a composite layer and a graphene layer on the silicon carbide substrate. The composite layer includes a metal.

21 Claims, 12 Drawing Sheets

(51) Int. Cl.
*H01L 29/66* (2006.01)
*H01L 29/45* (2006.01)
*H01L 29/16* (2006.01)
*H01L 21/02* (2006.01)
*C01B 31/04* (2006.01)
*H01L 29/786* (2006.01)

(52) U.S. Cl.
CPC ....... *H01L 29/78684* (2013.01); *H01L 29/1608* (2013.01)

(56) References Cited

U.S. PATENT DOCUMENTS

| | | | |
|---|---|---|---|
| 2010/0155859 A1* | 6/2010 | Raaijmakers | 257/412 |
| 2010/0163824 A1* | 7/2010 | Xu et al. | 257/2 |
| 2010/0224851 A1* | 9/2010 | Colombo et al. | 257/9 |
| 2011/0089404 A1* | 4/2011 | Marcus et al. | 257/29 |
| 2011/0163289 A1* | 7/2011 | Zhu | 257/9 |
| 2014/0061674 A1* | 3/2014 | Imai | 257/77 |
| 2014/0110662 A1* | 4/2014 | Duan et al. | 257/12 |

FOREIGN PATENT DOCUMENTS

| KR | 2011-0051584 A | 5/2011 |
|---|---|---|
| KR | 10-1148844 B1 | 5/2012 |

OTHER PUBLICATIONS

Srivastava, N. et al., "Graphene formed on SiC under various environments: Comparison of Si-face and C-face." Mar. 29, 2012.

Hsu, C. et al. "Electronic structures of an epitaxial graphene monolayer on SiC(0001) after metal intercalation (metal=Al, Ag, Au, Pt, and Pd): A first-principles study." *Applied Physics Letters*, 100: 063115-1-063115-4. American Institute of Physics. 2012.

Kang, C. et al. "Few-layer graphene growth on 6H-SiC(0001) surface at low temperature via Ni-silicidation reactions." *Applied Physics Letters*, 100: 251604-1-251604-5. American Institute of Physics. 2012.

\* cited by examiner

FIG. 8A
FIG. 8B
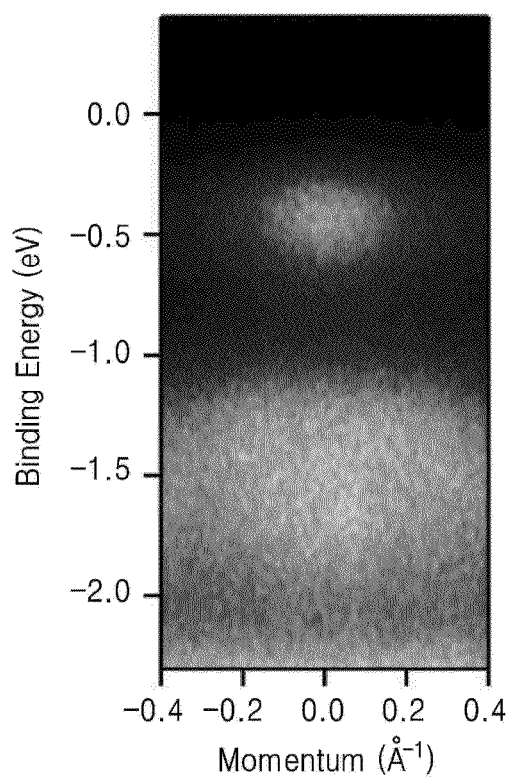
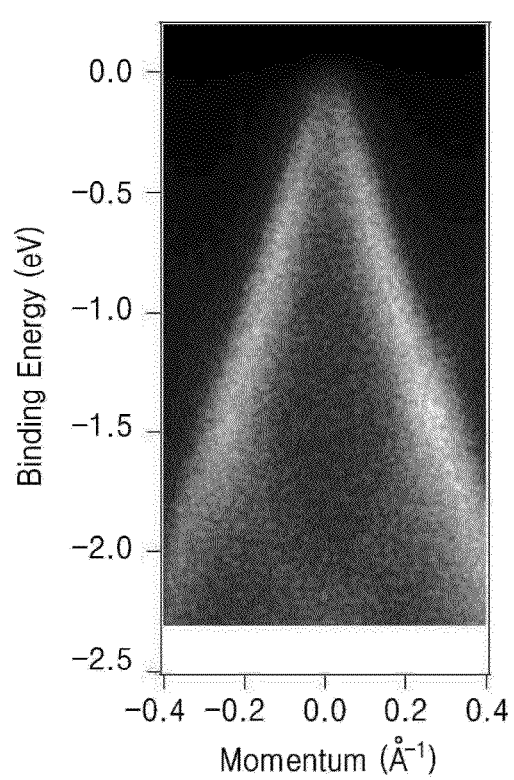

GRAPHENE STRUCTURE, GRAPHENE DEVICE INCLUDING SAME, AND METHOD OF MANUFACTURING GRAPHENE STRUCTURE

CROSS-REFERENCE TO RELATED APPLICATIONS

This application claims the benefit of priority from Korean Patent Application No. 10-2012-0151337, filed on Dec. 21, 2012 in the Korean Intellectual Property Office, the disclosure of which is incorporated herein by reference in its entirety.

BACKGROUND

1. Field

The present disclosure relates to a graphene structure, a graphene device including the same, and a method of manufacturing the graphene structure.

2. Description of the Related Art

In general, graphite has a structure in which plate-shaped 2D graphenes that are formed by hexagonally connected carbon atoms are stacked.

The graphene may be usefully used for various electrical devices such as display device electrodes or solar cell electrodes because of its excellent transparency and conductivity.

The graphene is formed through a thermal treatment process after supplying a carbon supply source to a metal catalyst and subsequently, obtained graphene is separated and transferred onto a given substrate to manufacture an electrical device.

The graphene is a 2D conductive material which includes a hexagonal system of carbon atoms as a single layer, and has received attention as a new material for semiconductor devices due to its characteristic of having higher electron mobility than silicon. In addition, the graphene has a current density of up to one hundred times that of copper and may be made to have a transparent flexible form, thus being highly applicable to portable devices.

Ways of obtaining such graphene roughly include peeling off to separate the graphene from single crystal silicon, chemical vapor deposition to derive the graphene from a surface of a metal catalyst by using a carbon source, and epitaxial growth to make a graphene layer grow on a silicon carbide substrate.

The epitaxial growth may result in a wide region of graphene of higher quality as compared to the other methods and is thus favorable in making devices having high electron mobility. However, it has limitations in terms of forming a uniform graphene layer and thus electron mobility also decreases accordingly.

SUMMARY

An example embodiment relates to methods of manufacturing a graphene structure including a graphene layer.

Another example embodiment relates to graphene devices.

A further example embodiment relates to graphene structures with a graphene layer.

According to an example embodiment, a method of manufacturing a graphene structure includes depositing a metal layer over a silicon carbide substrate; and performing, at a first temperature, a first heat treatment on the silicon carbide substrate over which the metal layer is deposited to form a composite layer and a graphene layer on the silicon carbide substrate. The composite layer includes a metal.

The method may further include performing a second heat treatment on the silicon carbide substrate at a second temperature before depositing the metal layer.

The second temperature may be about 1010° C. to about 1100° C.

Silicon and carbon may be non-uniformly distributed on a surface of the silicon carbide substrate over which the metal layer is deposited.

The deposition of the metal layer may be performed at about 20° C.-25° C.

The first temperature may be about 810° C. to about 900° C.

The composite layer may include at least one of metal-silicide and a metal material.

The metal-silicide may be formed over a region of the silicon carbide substrate containing more silicon than carbon on a surface of the silicon carbide substrate.

The metal material may be formed on a region of the silicon carbide substrate containing more carbon than silicon on a surface of the silicon carbide substrate.

The graphene layer may be single layer.

The graphene layer may be electrically neutral.

The composite layer may be interposed between the silicon carbide substrate and the graphene layer.

The method may further include performing a second heat treatment on the composite layer and the graphene layer at a second temperature to remove the metal remaining on the graphene layer.

The second temperature may be about 910° C. to about 1000° C.

The method may further include performing a second heat treatment on the metal containing composite layer and the graphene layer at a second temperature to remove the composite layer.

The second temperature may be about 1010° C. to about 1100° C.

The method may further include forming a hydrogen layer interposed between the silicon carbide substrate and the graphene layer.

According to another example embodiment, a graphene structure includes a silicon carbide substrate; a graphene layer over the silicon carbide substrate, the graphene layer having an electrically neutral property and being a single layer; and an inserting layer between the silicon carbide substrate and the graphene layer.

The inserting layer may include a compound containing a metal.

The inserting layer may be a hydrogen layer.

According to still another example embodiment, a graphene device includes the graphene structure, and a device layer on the graphene structure.

According to a further example embodiment, a method of manufacturing a graphene structure includes providing a seed layer over a silicon carbide layer, the seed layer including a metal; and extracting carbon from the silicon carbide layer to form a graphene layer and a graphene support. The graphene support is configured to support the graphene layer, and the graphene support includes the silicon carbide layer and a composite layer. The composite layer contains the metal from the seed layer.

The providing a seed layer may include forming the seed layer over a first portion of a surface of the silicon carbide layer. The first portion may be composed of more silicon than carbon.

The extracting carbon may include performing a heat treatment on the silicon carbide layer over which the seed layer is provided. The method may further include removing the composite layer, after forming the graphene layer; and forming a hydrogen layer between the silicon carbide layer and the graphene layer by using a hydrogen gas. The hydrogen layer may bind to the silicon carbide layer.

BRIEF DESCRIPTION OF THE DRAWINGS

Example embodiments will be more clearly understood from the following detailed description taken in conjunction with the accompanying drawings. FIGS. 1-10 represent non-limiting, example embodiments as described herein.

FIG. 1 is a sectional view of a graphene structure according to an example embodiment;

FIG. 8A is a graph of binding energy of a graphene layer when heating a graphene structure;

FIG. 8B is a graph of binding energy of a graphene layer when a second inserting layer is formed;

FIG. 9 illustrates an exemplary structure of a graphene device which is formed by transferring a graphene layer of a graphene structure, according to an example embodiment; and FIG. 10 illustrates an exemplary structure of a graphene device which is manufactured from a graphene structure, according to another example embodiment.

DETAILED DESCRIPTION

Figure 1:
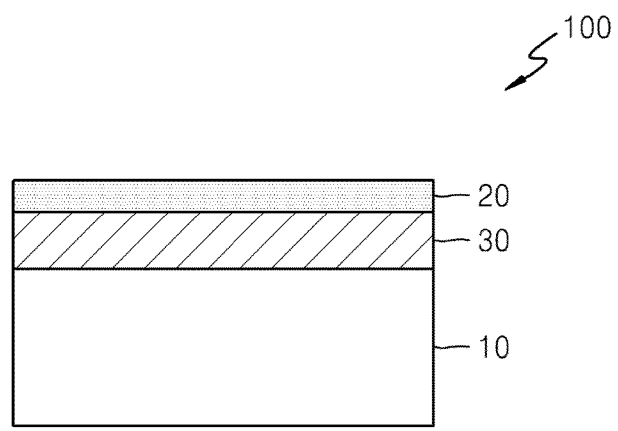

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items. Expressions such as "at least one of," when preceding a list of elements, modify the entire list of elements and do not modify the individual elements of the list.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A graphene structure, a graphene device including a graphene structure, and a manufacturing method thereof according to example embodiments will be described below with reference to the accompanying drawings. In the drawings, the dimensions of layers and regions may be exaggerated more or less for clarity of illustration.

FIG. 1 is a sectional view of a graphene structure according to an example embodiment.

Referring to FIG. 1, a graphene structure 100 includes a carbide silicon substrate 10, a graphene layer 20, and an inserting layer 30 which is deposited between the silicon carbide substrate 10 and the graphene layer 20.

The graphene layer 20 is formed as single layer above the silicon carbide substrate 10. The graphene may have a quasi-freestanding property which means that it has not been doped and does not combine as much with the silicon carbide substrate 10, and may have an electrically neutral property.

In addition, the inserting layer 30 is deposited between the silicon carbide substrate 10 and the graphene layer 20. An energy gap of such an inserting layer 30 may be smaller than that of the graphene layer 20. Such an inserting layer 30 may be a metal containing composite layer. For example, the inserting layer 30 may include metal-silicide in which metal is mixed with silicon, and a metal material which is formed of metal only. The metal may include at least one of palladium (Pd), copper (Cu), iron (Fe), and manganese (Mn). For convenience of description, an inserting layer which has a lower energy gap is referred to as a first inserting layer.

As such, if the inserting layer 30 with a lower energy gap is deposited between the silicon carbide substrate 10 and the graphene layer 20, it is possible to manufacture a graphene device by transferring graphene.

Meanwhile, the energy gap of the inserting layer 30 may be greater than that of the graphene layer 20. Such an inserting layer 30 may include a material such as hydrogen, oxygen, etc. For convenience of description, an inserting layer which has a higher energy gap is referred to as a second inserting layer.

As such, if the inserting layer 30 with a higher energy gap is deposited between the silicon carbide substrate 10 and the graphene layer 20, the arrangement has a merit in that it is possible to deposit components of an electronic device directly onto graphene.

FIGS. 2A to 2E are views describing a method of manufacturing a graphene structure including a first inserting layer according to an example embodiment.

Manufacturing the graphene structure including the first inserting layer may be performed in an ultra-high vacuum state. For example, it is possible to manufacture the graphene structure including the first inserting layer, within a vacuum state of $10^{-9}$ torr to $10^{-10}$ torr.

Figure 2A:
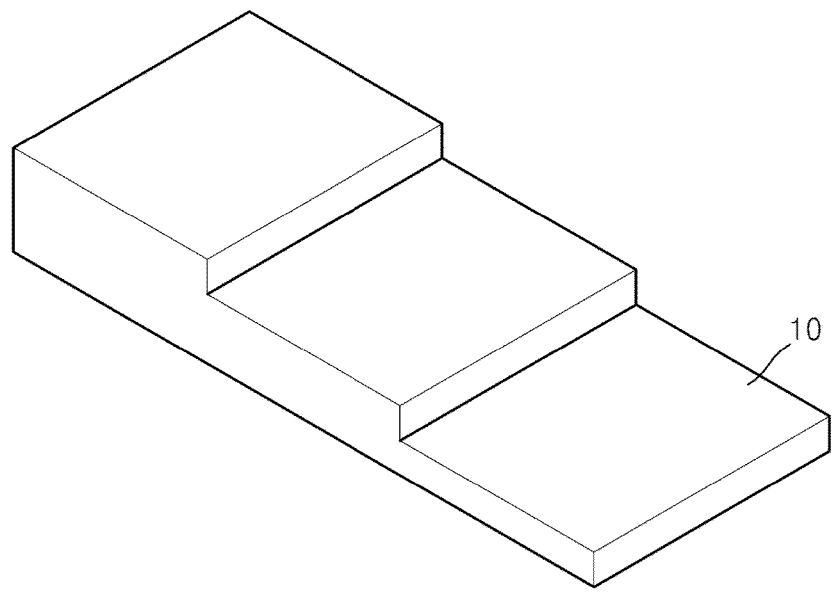
FIGS. 2A to 2E are views describing a method of manufacturing a graphene structure including a first inserting layer according to an example embodiment.

Referring to FIG. 2A, a silicon carbide substrate 10 is prepared. The silicon carbide (SiC) substrate 10 used in this manufacturing method is a crystalline substrate including carbon (C) and silicon (Si) ingredients (or, alternatively, components), these substrates being classified as 3C—SiC, 4H—SiC, 6H—SiC, etc. according to their crystal structures, and the processes described above may use them without limitation. In addition, the silicon carbide substrate 10 may have a p-type or an n-type that is obtained by doping with a dopant. As such a dopant, one or more of aluminum (Al), boron (B), nitrogen (N), phosphor (P), and transition metal may be used. As an example, chromium (Cr), manganese (Mn), iron (Fe) may be used.

In general, a surface of the silicon carbide substrate 10 may be stepped which involves changes in height on an atom basis. If heat treatment is performed on such a stepped silicon carbide substrate 10, the surface of the silicon carbide substrate 10 may be divided into a region 11 containing relatively (or, alternatively, substantially) more silicon and a region 12 containing relatively (or, alternatively, substantially) more carbon.

Figure 2B:
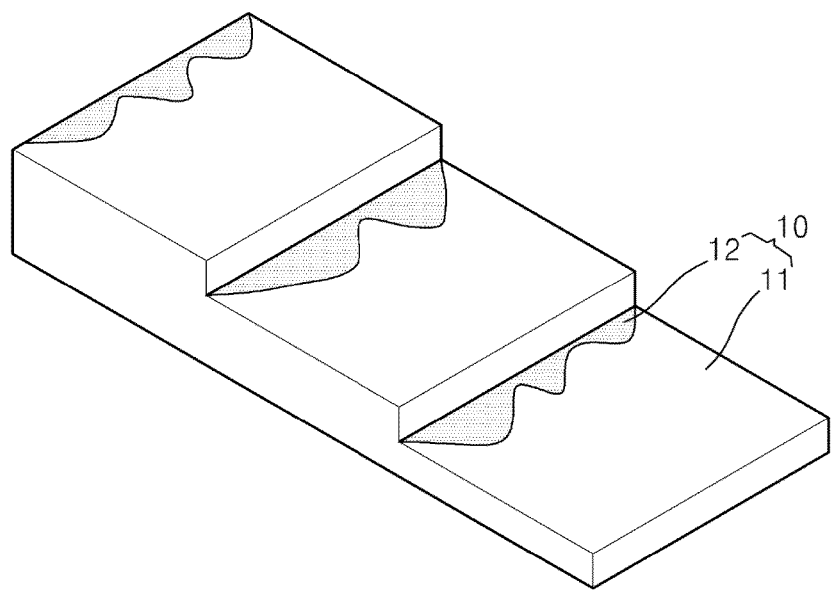

Referring to FIG. 2B, a heat treatment may be performed on the silicon carbide substrate 10. In addition, a heat treatment temperature of silicon carbide may be about 900° C. to about 1200° C. If the silicon carbide substrate 10 is heated, silicon may be deposited on (or, alternatively, removed from) the silicon carbide substrate 10. The silicon carbide substrate 10 is formed to have a single step shape on an atom basis, and thus silicon is more quickly deposited on (or, alternatively, removed from) a region adjacent to the step of the silicon carbide substrate 10 if the silicon carbide substrate 10 is heated. Therefore, a region adjacent to a height changing region of a surface of the silicon carbide substrate may become the region 12 containing relatively more carbon and the other region may become the region 11 containing relatively more silicon. The region 11 containing relatively more silicon and the region 12 containing relatively more carbon may expand, reduce, or change according to the heat treatment temperature.

As a heat source for the heat treatment, induction heating, radiant heat, laser, infrared (IR), microwave, plasma, ultra-violet (UV), or surface plasmon heating may be used without limitation. Such a heat source is attached to a chamber in which the silicon carbide substrate is deposited (or, alternatively, positioned), and plays a role in increasing the inner temperature of the chamber to a given temperature.

Figure 2C:
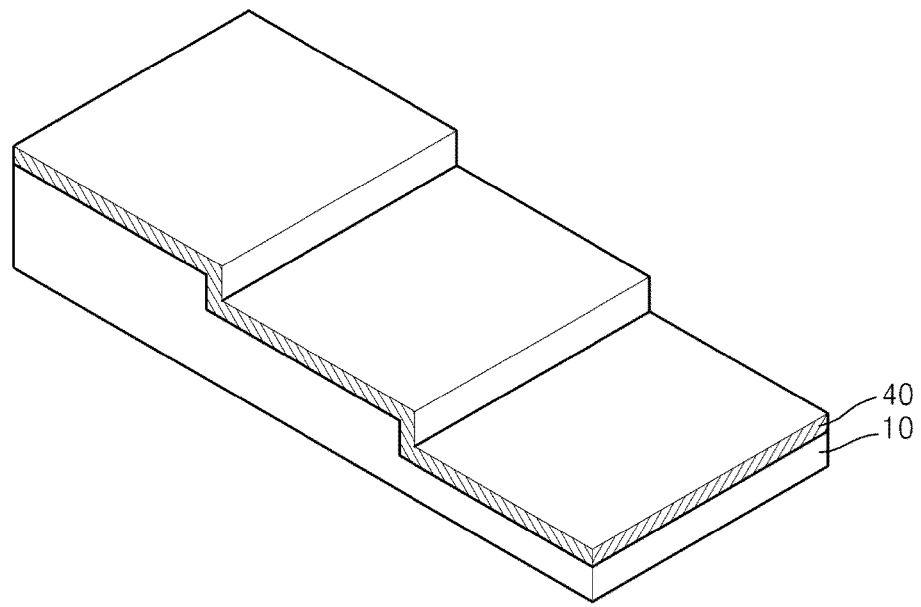

Referring to FIG. 2C, a metal layer 40 is deposited on the surface of the silicon carbide substrate 10. The metal of the metal layer 40 may include at least one of Pd, Cu, Fe and Mn. The amount of the metal (M) is not particularly limited. The metal M may be uniformly deposited on the silicon carbide substrate 10. The deposition of the metal M may be carried out, or performed, at room temperature (e.g., about 20° C. to 25° C.).

Figure 2D:
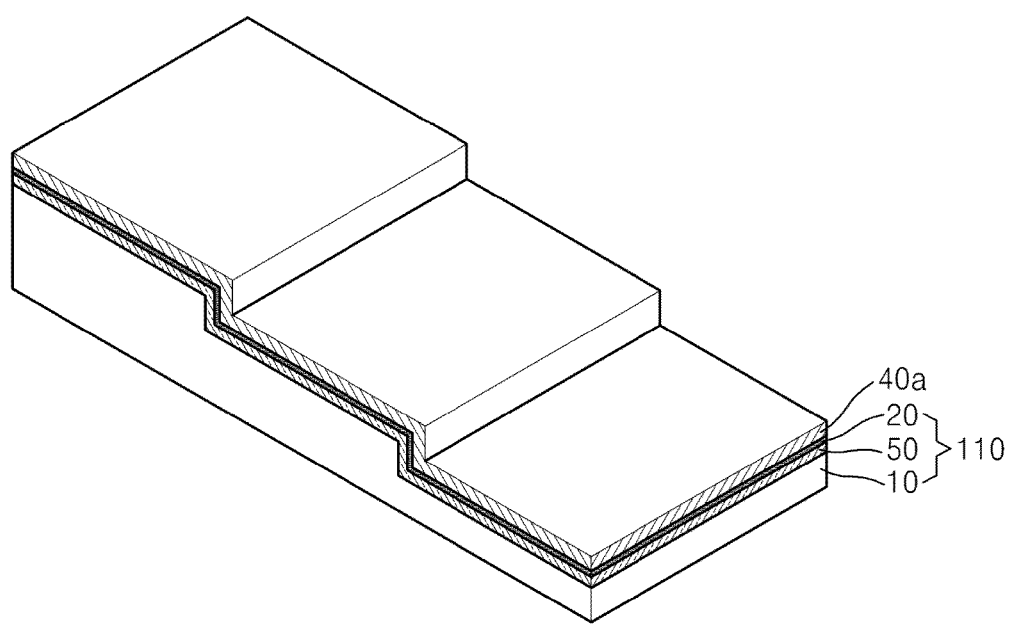

Then, a heat treatment may be performed on the silicon carbide substrate 10 on which the metal layer 40 is deposited. The heat treatment temperature may be about 810° C. to about 900° C. The temperature may gradually increase over time. Referring to FIG. 2D, a first inserting layer 50 and a graphene layer 20 are formed on the silicon carbide substrate 10. The first inserting layer 50 may include compounds (50a) in which silicon (Si) and metal 130 are contained, and metal materials (50b). The graphene layer 20 may have electrically neutral and quasi-freestanding properties. In addition, the graphene layer 20 may be a single layer. Thus, a graphene structure 110 is formed and includes the silicon carbide substrate 10, the first inserting layer 50 with silicon (Si), and the graphene layer 20.

Figure 2E:
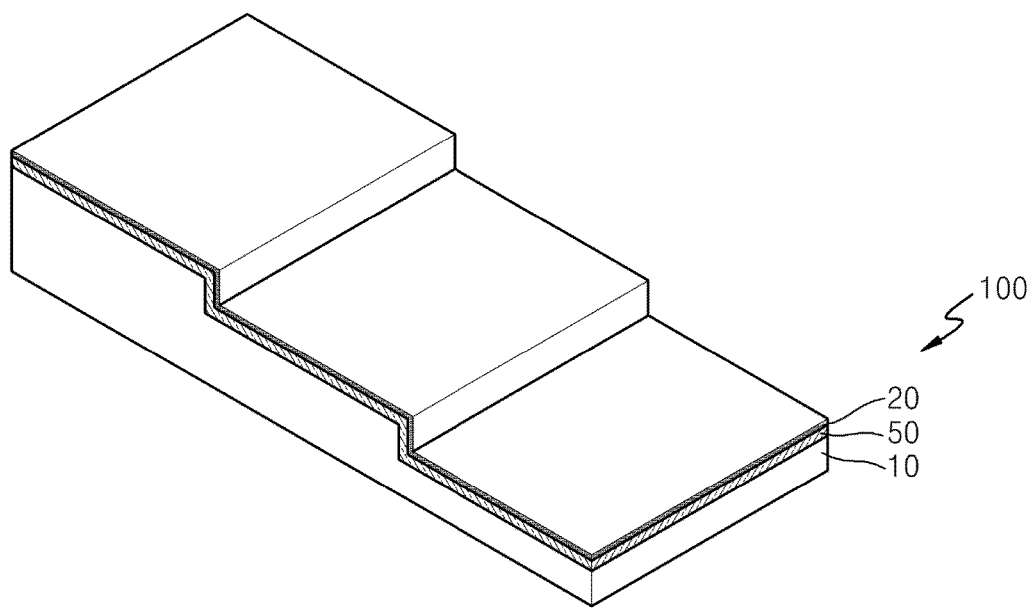

Lastly, the heat treatment temperature of a product produced in FIG. 2D slightly increases. The heat treatment temperature may be about 910° C. to about 1000° C. in this case. Referring to FIG. 2E, a metal layer 40a remaining on the graphene layer 20 is sublimated and as a result, only the graphene structure 110 that includes the silicon carbide substrate 10, the first inserting layer 50, and the graphene layer 20 remains.

Figure 3A:
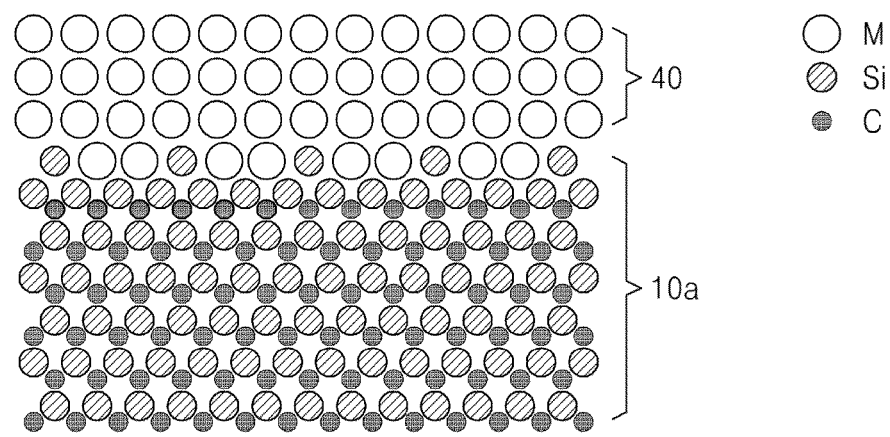
FIGS. 3A to 3C are views illustrating, on an atom basis, processes of forming a graphene layer on a region containing relatively more silicon.
Figure 3B:
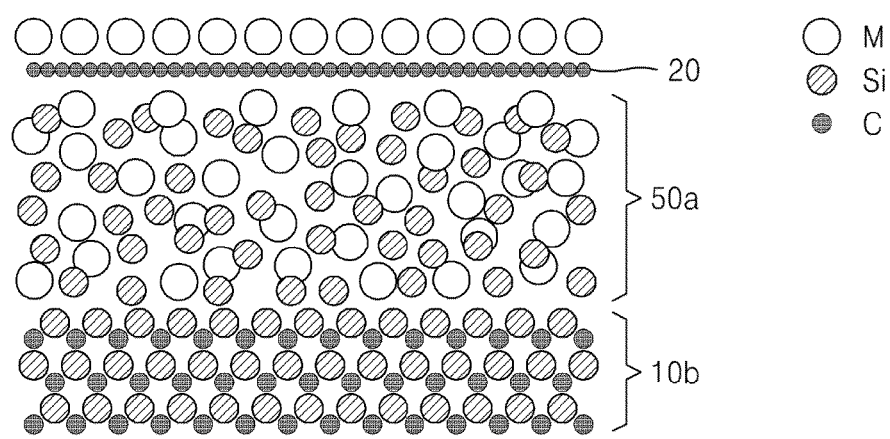
Figure 3C:
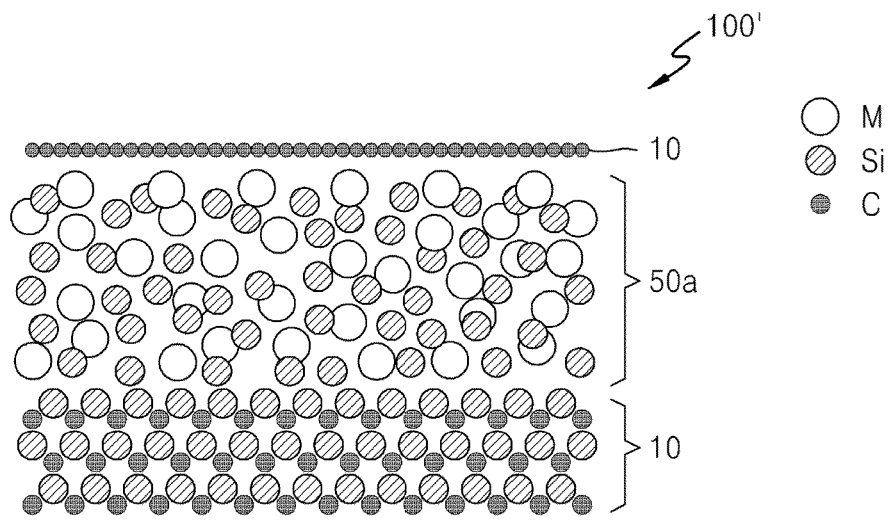
Figure 4A:
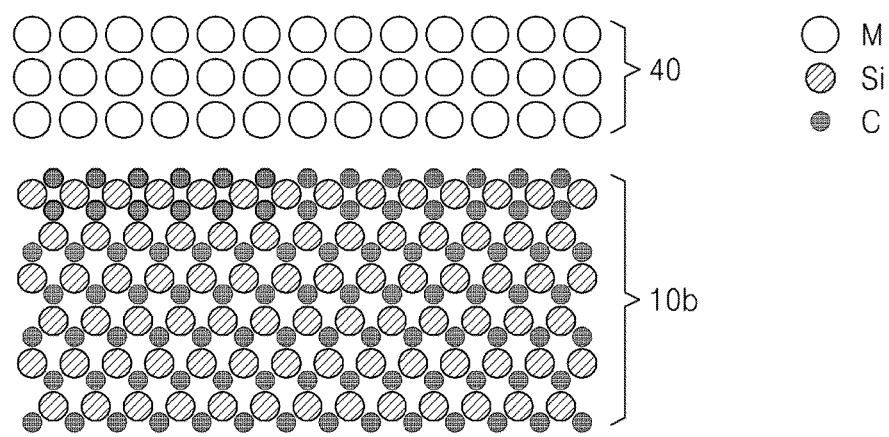
FIGS. 4A to 4C are views illustrating, on an atom basis, processes of forming a graphene layer on a region containing relatively more carbon.
Figure 4B:
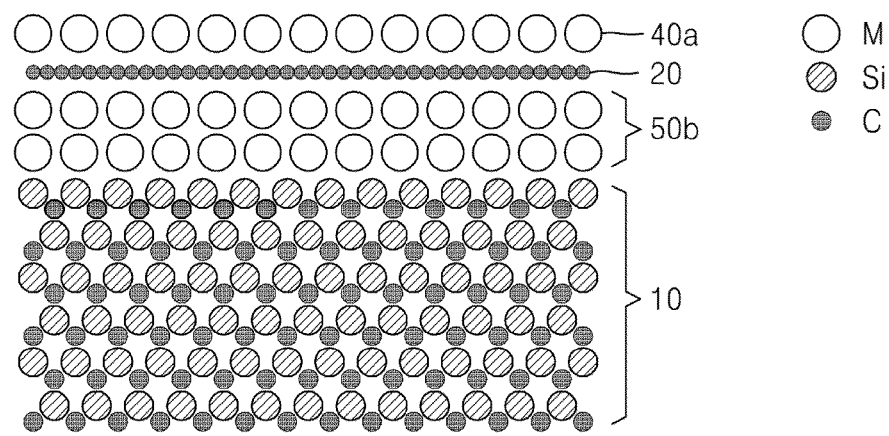
Figure 4C:
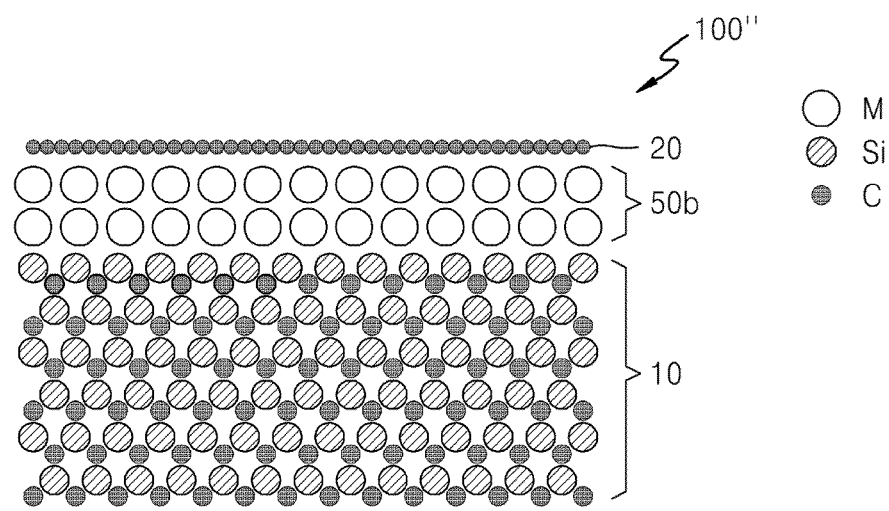

FIGS. 3A to 3C are views illustrating, on an atom basis, processes of forming a graphene layer on a region containing relatively more silicon, and FIGS. 4A to 4C are views illustrating, on an atom basis, processes of forming a graphene layer on a region containing relatively more carbon.

Referring to FIG. 3A, metal M may be deposited on the silicon carbide substrate 10. In addition, if the silicon carbide substrate 10 on which the metal M is deposited is heated, the metal M which is deposited on the region containing relatively more silicon combines with silicon (Si) to form metal-silicide, and silicon (Si) of silicon carbide is separated from carbon (C) and combines with the metal M to form metal-silicide, and as a result compounds 50a with the metal M are formed, as illustrated in FIG. 3B. Therefore, remaining carbon atoms are spread to a surface of the metal-silicide to form the graphene layer 20. Furthermore, if the heating temperature of the silicon carbide substrate 10 with the graphene layer 20 slightly increases, the metal M remaining on the graphene layer 20 is sublimated and thus only the graphene structure 100' as illustrated in FIG. 3C remains.

Referring to FIG. 4A, the metal M may be deposited on the silicon carbide substrate 10. If the silicon carbide substrate 10 on which the metal M is deposited is heated, the metal M which is deposited on the region containing relatively more carbon is inserted between the silicon carbide substrate 10 and the carbon (C) to form a metal layer 50b, as illustrated in FIG. 4B. The carbon (C), which is spread onto a surface of the metal (M) by the pulling operation of the metal (M), combines together to form the graphene layer 20. Furthermore, if the heating temperature of the silicon carbide substrate 10 with the graphene layer 20 slightly increases, the metal (M) remaining on the graphene layer 20 is sublimated, and thus only the graphene structure 100" as illustrated in FIG. 4C remains.

The graphene layer formed in this way is uniformly formed without distinction by a boundary between the region containing relatively more silicon and the region containing relatively more carbon. In other words, the graphene layer is generally formed on the silicon carbide substrate without distinction between a region adjacent to a height changing region of the silicon carbide substrate and the other regions thereof.

A graphene structure including a first inserting layer is manufactured by a manufacturing method as described previously. In particular, a silicon carbide substrate is heated at a temperature of about 1025° C. for 30 minutes in an ultra-high vacuum chamber.

Figure 5A:
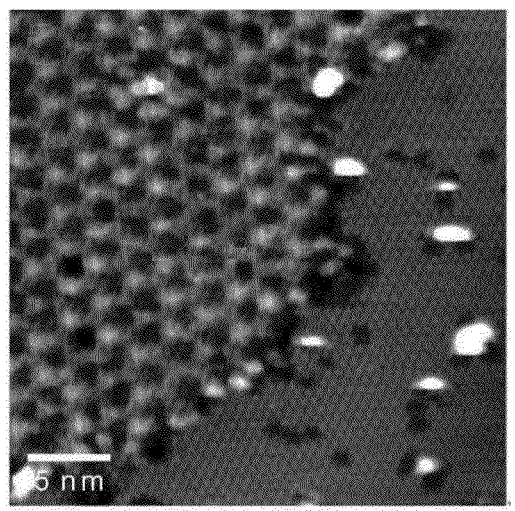
FIG. 5A is a scanning tunneling microscope (STM) image of a silicon carbide substrate while it is being heated.

FIG. 5A is a scanning tunneling microscope (STM) image of a silicon carbide substrate captured when heating the silicon carbide substrate.

Referring to FIG. 5A, a region containing relatively more silicon and a region containing relatively more carbon coexist on a surface of the silicon carbide substrate.

In addition, metal has been deposited on the silicon carbide substrate at about room temperature. As the metal, Pd is used. A graphene layer is formed by performing heat treatment at a temperature of about 870° C. on the silicon carbide substrate on which the metal has been deposited, and then heat treatment is again performed at a temperature of about 950° C. on the silicon carbide substrate.

Figure 5B:
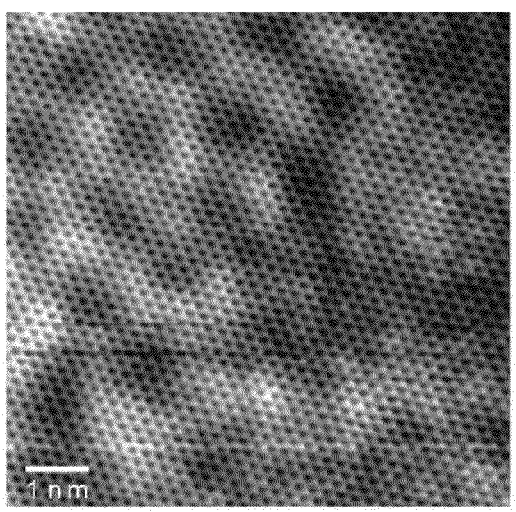
FIG. 5B is a view of an STM image of a surface of a graphene structure according to an example embodiment.

FIG. 5B is an STM image of a surface of a graphene structure according to an example embodiment.

Referring to FIG. 5B, only honeycomb grids are represented on the surface of the graphene structure. If graphene is formed as a plurality of layers, the honeycomb grids will be overlapped and thus appear as being overlapped on the STM image. However, it may be seen from the fact that the honeycomb grids are deposited in a row that the graphene of a graphene structure according to an example embodiment, is formed as a single layer. In addition, it may be confirmed that the honeycomb grids are deposited in a row without a boundary between a region containing relatively more carbon and a region containing relatively more silicon.

Figure 6A:
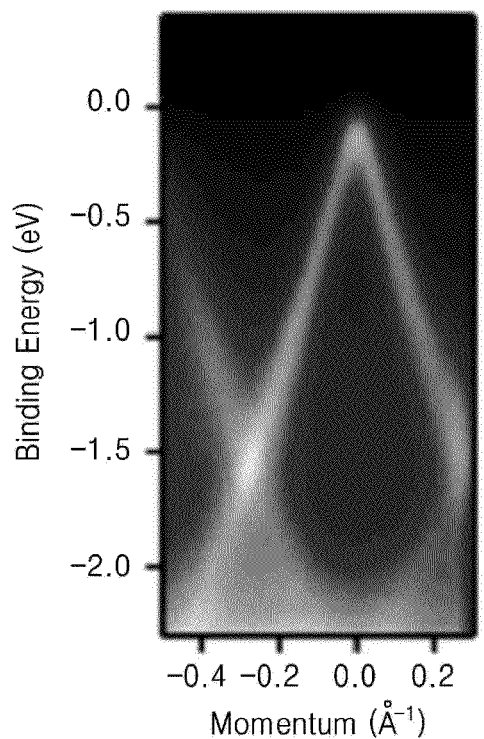
FIG. 6A is a view of binding energy of a graphene layer which is formed on a region containing relatively more silicon of a silicon carbide substrate.
Figure 6B:
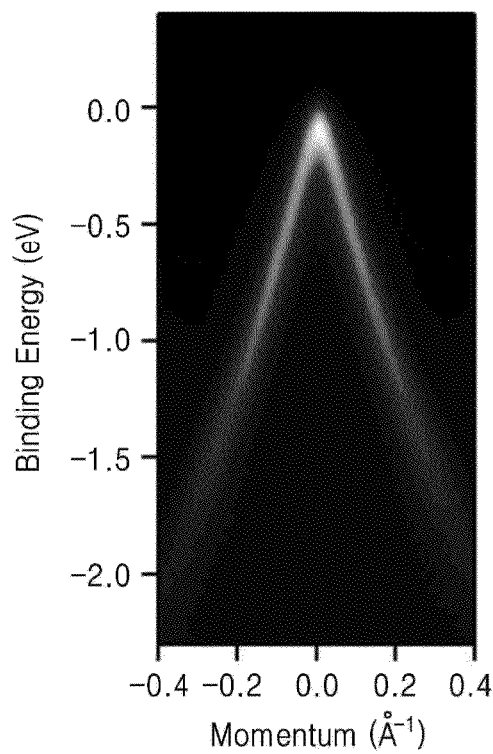
FIG. 6B is a view of binding energy of a graphene layer which is formed on a region containing relatively more carbon of a silicon carbide substrate.

FIG. 6A is a view of binding energy of a graphene layer which is formed on a region containing relatively more silicon of a silicon carbide substrate, and FIG. 6B is a view of binding energy of a graphene layer which is formed on a region containing relatively more carbon of a silicon carbide substrate.

Referring to FIGS. 6A and 6B, binding energy of a graphene layer has the peak at a point with an energy level of 0, regardless of whether the graphene layer has been disposed on the region containing relatively more silicon or the region containing relatively more carbon. Therefore, it may be said that the graphene layer has a quasi-freestanding property, and it may be confirmed that the graphene layer has an electrically neutral property.

Next, a method of manufacturing a graphene structure including a second inserting layer will be described.

Figure 7A:
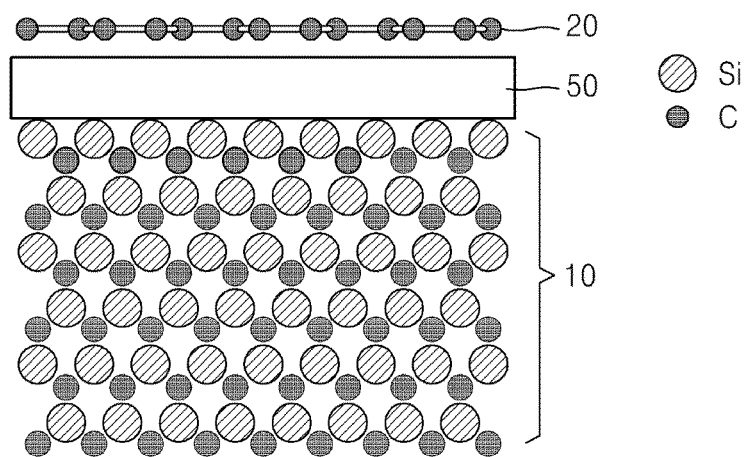
FIGS. 7A to 7C are views describing a method of manufacturing a graphene structure including a second inserting layer, according to another example embodiment.
Figure 7B:
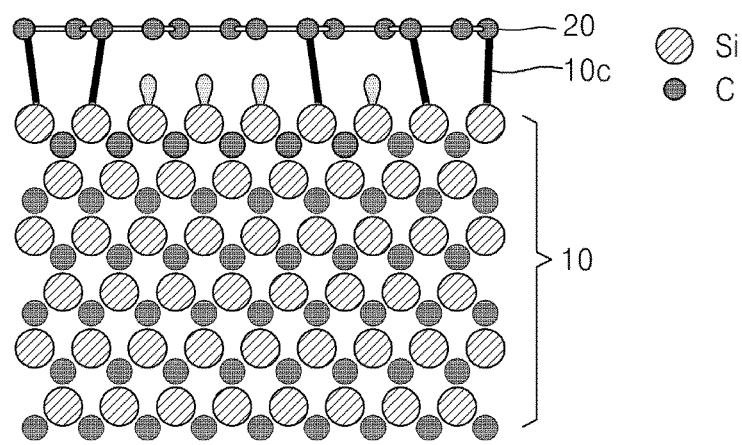
Figure 7C:
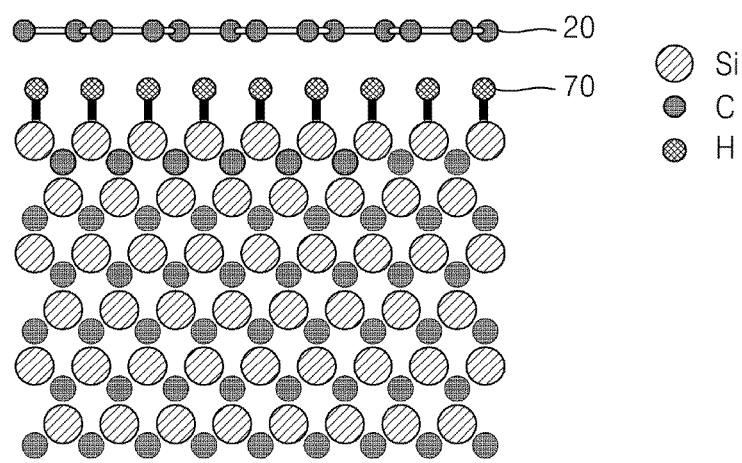

FIGS. 7A to 7C are views describing a method of manufacturing a graphene structure including a second inserting layer, according to another example embodiment.

Referring to FIG. 7A, a heat treatment is performed on the graphene structure 110 including the first inserting layer 50. A heat treatment temperature may be a temperature at which the first inserting layer 50 may be sublimated. For example, the heat treatment temperature may be about 1010° C. to about 1100° C. If the first inserting layer 50 is sublimated, carbon (C) of the graphene layer 20 may again combine with silicon (Si) of the silicon carbide substrate 10 as illustrated in FIG. 7B. In other words, a dangling bond 10c of silicon (Si) within the silicon carbide substrate 10 may combine with carbon (C) of the graphene layer 20. Since carbon (C) of the graphene layer 20 combines with the dangling bond 10c of silicon (Si), the graphene layer 20 may lose its original property. Then, hydrogen (H) may be additionally injected into a product of FIG. 7B. If hydrogen gases are heated at a temperature of about 600° C. to about 800° C. in a chamber with an inner pressure of 700 torr to 800 torr, then they are separated on an atom basis and the dangling bond 10c of silicon (Si) is separated from carbon (C) and then combines with hydrogen atoms to form a second inserting layer 70. The second inserting layer 70 may be a hydrogen (H) layer. The graphene layer 20 gets its original property back due to the disposition of the second inserting layer 70.

A graphene structure including a second inserting layer is manufactured by a manufacturing method as described previously. In particular, the graphene structure including the first inserting layer is heated at a temperature of about 1050° C. in an ultra-high vacuum chamber.

FIG. 8A is a graph of binding energy of a graphene layer when heating the graphene structure.

Referring to FIG. 8A, the binding energy of the graphene layer does not have a peak at a point where an energy level is 0. Therefore, it may be confirmed that a property of the graphene layer in the graphene structure including the first inserting layer has changed.

Subsequently, hydrogen (H) gases are injected into a chamber and heating is performed at a pressure of about 750 torr and at a temperature of about 700° C. Then, hydrogen (H) atoms are inserted between the graphene layer and the silicon carbide substrate to form a second inserting layer that is a hydrogen layer.

FIG. 8B is a graph of binding energy of the graphene layer when the second inserting layer is formed.

Referring to FIG. 8B, the binding energy of the graphene layer has the peak near a point where an energy level is 0. Therefore, it may be confirmed that the graphene layer in the graphene structure including the second inserting layer has switched to its original property.

A graphene structure manufactured as above may be utilized for various purposes. First, it has good conductivity and may be usefully used as a transparent electrode since its membrane uniformity is high. For solar cells, electrodes are used on their substrates and in particular, transparent electrodes are required due to the property that the electrodes have to transmit light. If a layered structure with the graphene is used as such a transparent electrode, it represents good conductivity. In addition, if utilized as a conductive thin film for each panel of various kinds of display devices, the layered structure may represent desired conductivity even when a small quantity thereof is used and enables improvement in transmittance of light.

In addition, the layered structure may be used to form a channel for a memory device, a sensor, e-paper, etc. In other words, since the graphene structure has graphene on an insulating layer, it may be utilized as a gate electrode in various transistors such as a field effect transistor (FET).

In addition, the graphene structure may be applied to a display device in which a transparent electrode is used. The display device may include an e-paper display device, an organic light-emitting display device, a liquid crystal display (LCD) device, etc., for example.

The organic light-emitting display device is an active light-emitting display device using a principle that light is emitted while electrons and holes combine at an organic film if current is applied to a fluorescent or phosphorous organic compound thin film. A general organic electroluminescent device has an anode on a substrate and has a structure in which a hole transport layer (HTL), an emission layer, an electron transport layer (ETL), and a cathode are sequentially disposed on the anode. It is possible to further include an electron injection layer (EIL) and a hole injection layer (HIL) so as to better facilitate the injection of electrons and holes, and it is possible to further include a hole blocking layer (HBL) and a buffer layer as needed. Since a material of the anode has a transparent property and good conductivity, a transparent electrode that includes the layered structure containing graphene according to the implementation above may be usefully used.

According to another implementation, the graphene structure may be used for various electrical devices that may include sensors, bipolar junction transistors (BJTs), FETs, heterojunction bipolar transistors (HJBTs), single electron transistors, light-emitting diodes (LEDs), and organic light-emitting diodes (OLEDs), for example. The graphene structure may be used for a channel layer, an electrode, or a buffer between the electrode and the channel layer, in such devices.

Figure 9:
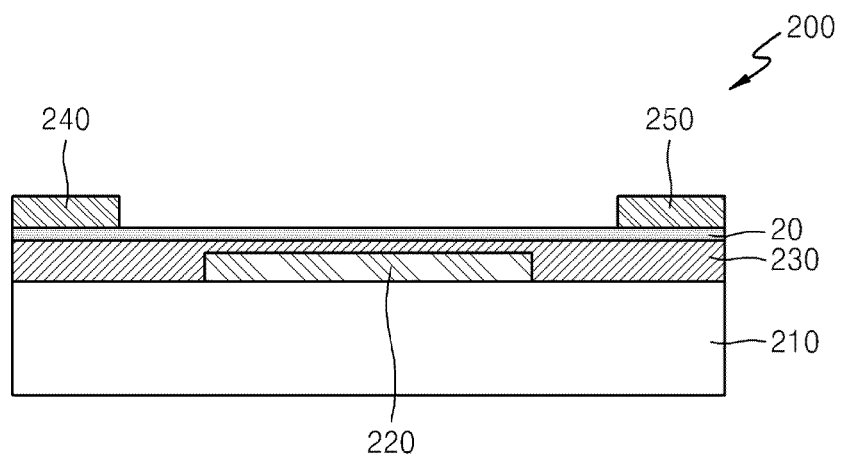

FIG. 9 illustrates an exemplary structure of a graphene device which is formed by transferring a graphene layer of a graphene structure according to an example embodiment.

A structure may be used in which a gate electrode 220 is formed on a substrate 210 and an insulating layer 230 covers the gate electrode 220. The graphene layer 20 of the graphene structure 110 of FIG. 2E may be transferred onto the insulating layer 230. In addition, a source electrode 240 and a drain electrode 250 are further disposed on the graphene layer so that a graphene device 200 may be manufactured as in FIG. 9. Such a graphene device 200 may be a transistor in which the graphene layer 20 functions as a channel layer. In addition, in the case of the transistor, a light-emitting device is electrically coupled to the transistor and then it is possible to control the light-emitting device by using current between a source and a drain and it is possible to configure a flat panel display device by using the light-emitting device.

Figure 10:
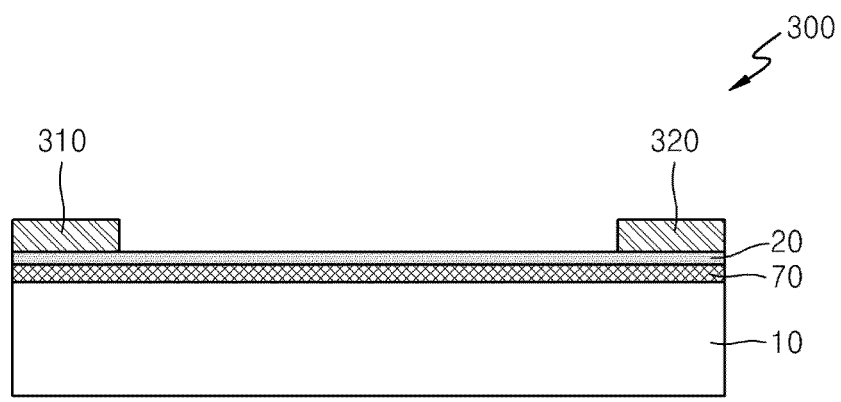

FIG. 10 illustrates an exemplary structure of a graphene device which is manufactured from a graphene structure, according to another example embodiment.

The process of disposing a first electrode 310 and a second electrode 320 on the graphene layer 20 of a graphene structure 120 may be further performed, and a graphene device 300 as in FIG. 10 may be manufactured. Such a graphene device 300 may be applied as a sensor, the graphene layer 20 may function as a sensor and a change in electrical property due to adsorption of a specific material may be measured from the first electrode 310 and the second electrode 320.

In addition, although exemplary embodiments have been illustrated and described above, the present disclosure is not limited to specific embodiments described above but may be varied by those of ordinary skill in the art without departing from the subject matter of the present disclosure claimed in the following claims. Furthermore, these variations should not be understood individually from the technical spirit or perspective of the present disclosure. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a graphene structure, the method comprising:
   depositing a metal layer over a silicon carbide substrate; and
   performing, at a first temperature, a first heat treatment on the silicon carbide substrate over which the metal layer is deposited to form simultaneously a composite layer and a graphene layer on the silicon carbide substrate, the composite layer including a metal, and
   the composite layer being interposed between the silicon carbide substrate and the graphene layer.

2. The method of claim 1, further comprising:
   performing a second heat treatment on the silicon carbide substrate at a second temperature before depositing the metal layer.

3. The method of claim 2, wherein the second temperature is about 1010° C. to about 1100° C.

4. The method of claim 1, wherein silicon and carbon are non-uniformly distributed on a surface of the silicon carbide substrate over which the metal layer is deposited.

5. The method of claim 1, wherein the deposition of the metal layer is performed at about 20° C.-25° C.

6. The method of claim 1, wherein the first temperature is about 810° C. to about 900° C.

7. The method of claim 1, wherein the composite layer includes at least one of metal-silicide and a metal material.

8. The method of claim 7, wherein the metal-silicide is formed over a region of the silicon carbide substrate containing more silicon than carbon on a surface of the silicon carbide substrate.

9. The method of claim 7, wherein the metal material is formed on a region of the silicon carbide substrate containing more carbon than silicon on a surface of the silicon carbide substrate.

10. The method of claim 1, wherein the graphene layer is a single layer.

11. The method of claim 1, wherein the graphene layer is electrically neutral.

12. The method of claim 1, further comprising:
performing a second heat treatment on the composite layer and the graphene layer at a second temperature to remove the metal remaining on the graphene layer.

13. The method of claim 12, wherein the second temperature is about 910° C. to about 1000° C.

14. The method of claim 1, further comprising:
performing a second heat treatment on the composite layer and the graphene layer at a second temperature to remove the composite layer.

15. The method of claim 14, wherein the second temperature is about 1010° C. to about 1100° C.

16. The method of claim 14, further comprising:
forming a hydrogen layer interposed between the silicon carbide substrate and the graphene layer.

17. A method of manufacturing a graphene structure, comprising:
providing a seed layer over a silicon carbide layer, the seed layer including a metal; and
extracting carbon from the silicon carbide layer to form a graphene layer and a graphene support, the graphene support being configured to support the graphene layer,
the graphene support including the silicon carbide layer and a composite layer, and
the composite layer containing the metal from the seed layer.

18. The method of claim 17, wherein,
the providing a seed layer includes forming the seed layer over a first portion of a surface of the silicon carbide layer, the first portion being composed of more silicon than carbon.

19. The method of claim 17, wherein the extracting carbon includes performing a heat treatment on the silicon carbide layer over which the seed layer is provided.

20. The method of claim 17, further comprising:
removing the composite layer, after forming the graphene layer; and
forming a hydrogen layer between the silicon carbide layer and the graphene layer by using a hydrogen gas, the hydrogen layer binding to the silicon carbide layer.

21. The method of claim 1, wherein the performing a first heat treatment on the silicon carbide substrate over which the metal layer is deposited to form the graphene layer includes extracting carbon from the silicon carbide substrate to form the graphene layer.

* * * * *